(12) United States Patent
Morton et al.

(10) Patent No.: US 7,356,102 B2
(45) Date of Patent: Apr. 8, 2008

(54) GAIN COMPENSATION OVER TEMPERATURE AND FREQUENCY VARIATIONS IN WIRELESS TRANSCEIVERS

(75) Inventors: Steven P. Morton, Nepean (CA); Qing Zhong Jiao, Nepean (CA); Xin Jin, Nepean (CA)

(73) Assignee: Research In Motion Limited, Waterloo (CA)

( * ) Notice: Subject to any disclaimer, the term of this patent is extended or adjusted under 35 U.S.C. 154(b) by 772 days.

(21) Appl. No.: 10/725,689

(22) Filed: Dec. 2, 2003

(65) Prior Publication Data

US 2004/0213355 A1  Oct. 28, 2004

Related U.S. Application Data

(60) Provisional application No. 60/430,955, filed on Dec. 4, 2002.

(51) Int. Cl.
*H04L 27/08*  (2006.01)
(52) U.S. Cl. .............. 375/345; 375/297; 375/296; 330/52; 330/279
(58) Field of Classification Search .............. 375/345, 375/297, 296; 330/129, 52, 2, 279
See application file for complete search history.

(56) References Cited

U.S. PATENT DOCUMENTS 3,818,364 A  *  6/1974  Barret ................. 330/52
4,370,681 A  *  1/1983  Akagiri ................ 360/68
5,081,713 A  *  1/1992  Miyazaki .............. 455/76
5,687,195 A  *  11/1997  Hwang et al. ........ 375/345
5,818,386 A  *  10/1998  Belisle ................. 342/372
5,982,824 A  *  11/1999  Ann .................... 375/345
6,115,587 A     9/2000  Kim
6,169,455 B1 *  1/2001  Yamaguchi .......... 330/279
6,418,301 B1    7/2002  Le et al.
6,480,061 B2 *  11/2002  Dolman et al. ......... 330/2
6,552,608 B2 *  4/2003  Matsuda et al. ....... 330/52
6,639,983 B1 *  10/2003  Kielty et al. ...... 379/399.01
6,956,432 B2 *  10/2005  Kobayashi et al. ..... 330/129
2002/0084776 A1 *  7/2002  Barker ................ 324/76.53

FOREIGN PATENT DOCUMENTS

EP  0 396 347 A2  11/1990

* cited by examiner

*Primary Examiner*—Phuong Phu
(74) *Attorney, Agent, or Firm*—Jones Day; Krishna K. Pathiyal; Robert C. Liang

(57) ABSTRACT

Systems and methods are provided for controlling gain compensation over temperature and frequency variations. A variable amplifier may be used to receive a control signal and an input signal. The variable amplifier may be operable to apply a gain to the input signal to generate an output signal, wherein the gain is a function of the control signal. A summation module may be used to combine a gain reference signal and a gain variation signal to generate the control signal. The gain reference signal may be calibrated at a reference temperature and a reference frequency. A gain calibration module may be used to output the gain variation signal as a function of both a current operating temperature and a current operating frequency.

8 Claims, 9 Drawing Sheets

GAIN COMPENSATION OVER TEMPERATURE AND FREQUENCY VARIATIONS IN WIRELESS TRANSCEIVERS

CROSS-REFERENCE TO RELATED APPLICATION

This application claims priority from and is related to the following prior application: "System and Apparatus for Gain Compensation Over Temperature and Frequency Variations in Wireless Transceivers," U.S. Provisional Application No. 60/430,955, filed Dec. 4, 2002. This prior application, including the entire written description and drawing figures, is hereby incorporated into the present application by reference.

FIELD

The technology described in this patent document relates generally to the field of gain control systems. More particularly, the patent document describes a system and method for gain compensation over temperature and frequency. The technology described herein is particularly useful in wireless transceivers.

SUMMARY AND BACKGROUND

Wireless transceivers that require precise gain control and compensation are known in the art. In addition, because gain (or loss) of many components in a wireless transceiver may vary with temperature, it is often desirable to compensate for temperature-dependent gain variation. However, the temperature-dependant gain variation in a wireless transceiver may vary depending upon the transceiver operating frequency.

Systems and methods are provided for controlling gain compensation over temperature and frequency variations. A variable amplifier may be used to receive a control signal and an input signal. The variable amplifier may be operable to apply a gain to the input signal to generate an output signal, wherein the gain is a function of the control signal. A summation module may be used to combine a gain reference signal and a gain variation signal to generate the control signal. The gain reference signal may be calibrated at a reference temperature and a reference frequency. A gain calibration module may be used to output the gain variation signal as a function of both a current operating temperature and a current operating frequency.

DETAILED DESCRIPTION

Figure 1A:
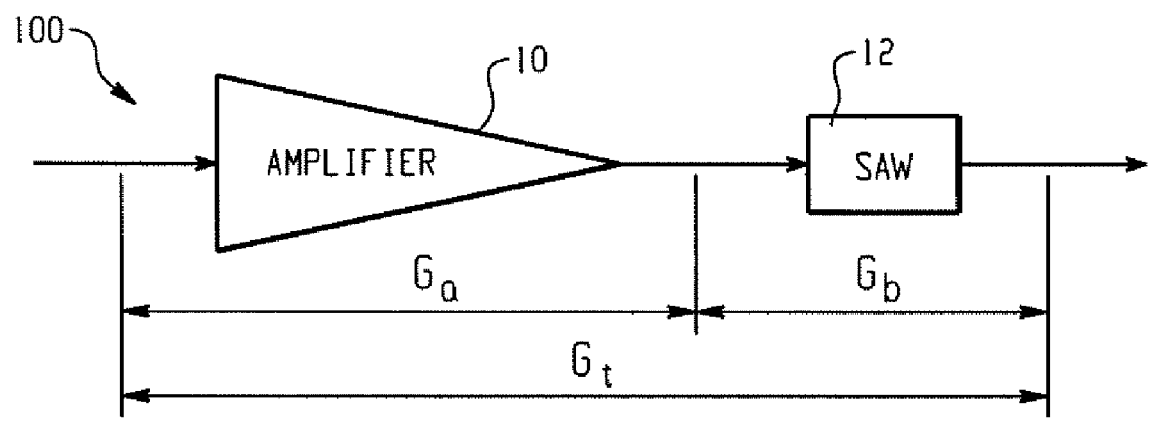
FIGS. 1A-1D illustrate typical frequency and temperature dependent gain fluctuation in a transceiver.
Figure 1B:
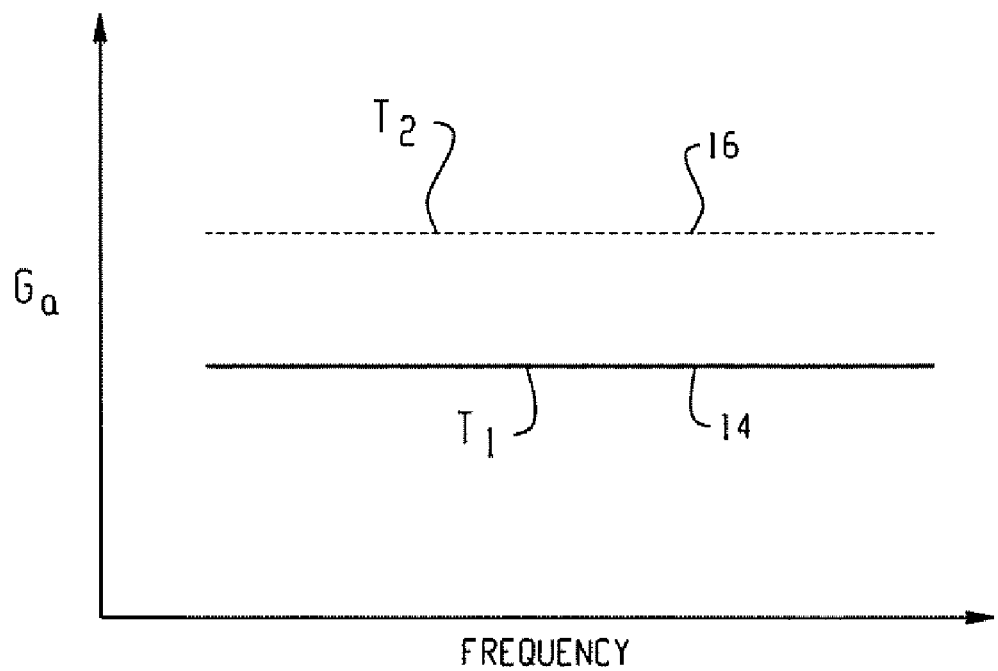
Figure 1C:
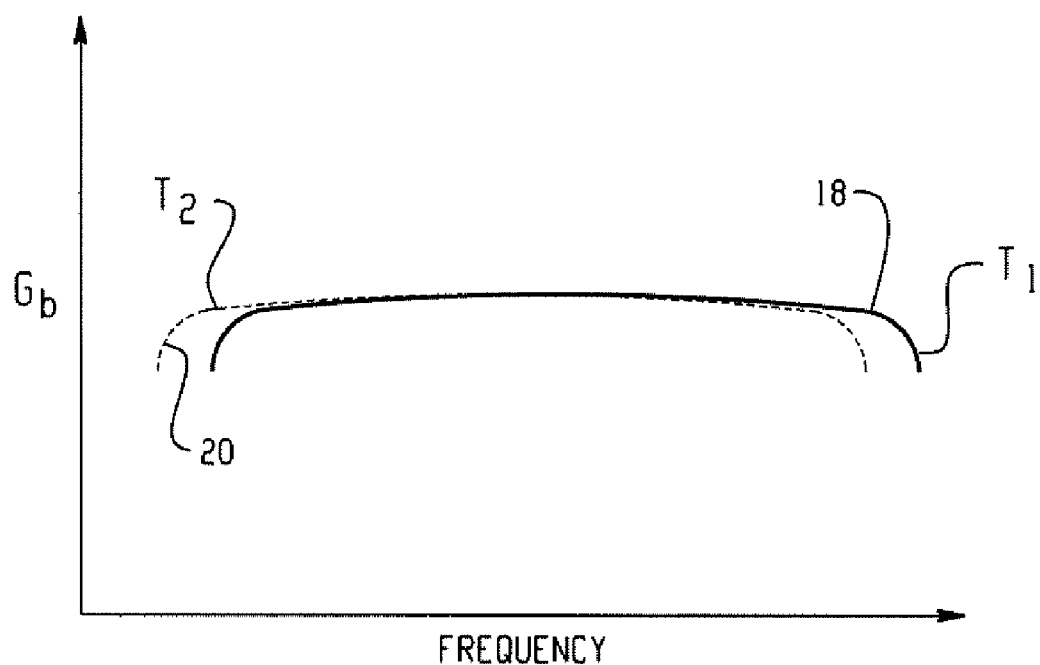
Figure 1D:
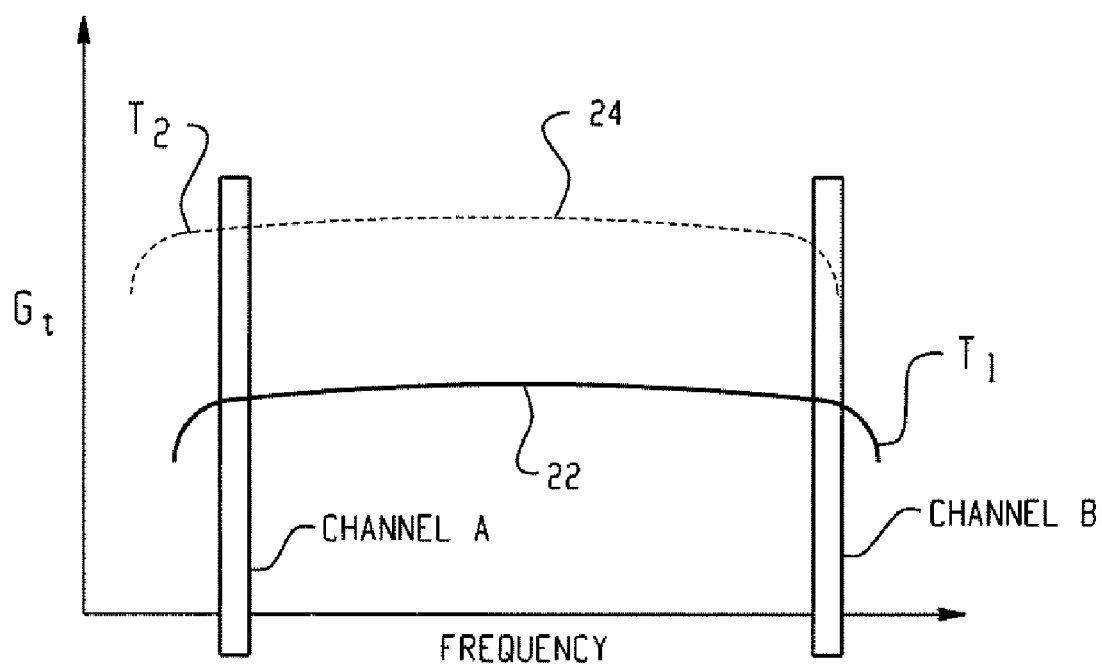

With reference now to the drawing figures, FIGS. 1A-1D illustrate typical frequency and temperature dependent gain fluctuation in a transceiver. FIG. 1A illustrates an amplifier 10 having a gain Ga and a SAW filter 12 having a gain Gb, which may be cascaded in a transceiver circuit to produce a total gain Gt. FIG. 1B shows the frequency responses 14, 16 of the amplifier gain Ga at temperatures T1 and T2. As illustrated, the amplifier gain Ga varies with temperature, but has a relatively flat frequency response. FIG. 1C shows the frequency responses 18, 20 of the SAW filter gain Gb at temperatures T1 and T2. The SAW filter gain Gb has a band pass frequency response that shifts frequency as a function of temperature. The combined gain variation Gt of the amplifier 10 and SAW filter 12 is shown in FIG. 1D at temperatures T1 and T2. FIG. 1D illustrates that a transceiver operating at a first frequency band (Channel A) may need to compensate for a different amount of gain variation Gt than a transceiver operating in a second frequency band (Channel B). That is, the amount of temperature compensation is typically not independent of operating frequency, and vice versa.

Figure 2:
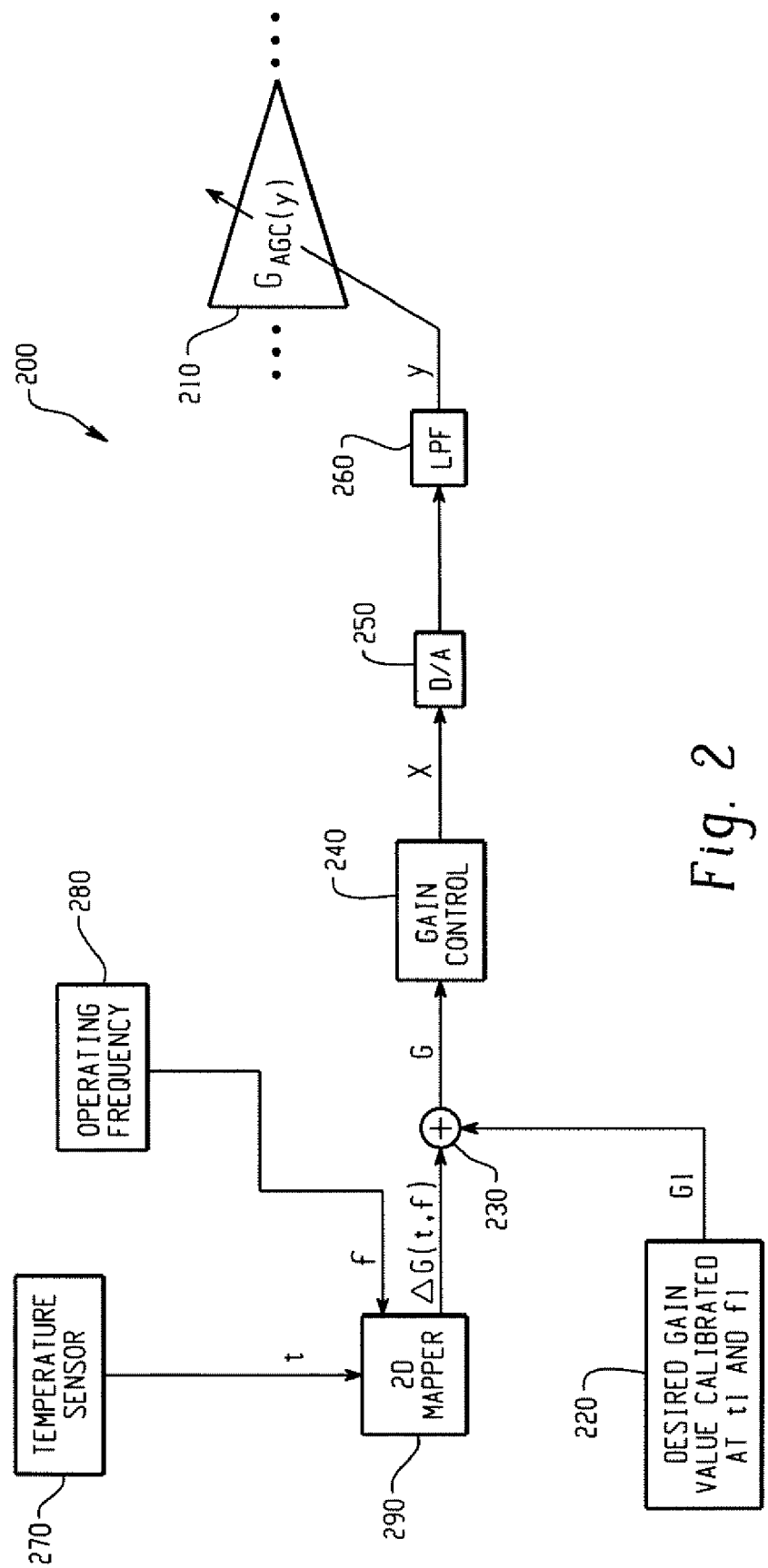
FIG. 2 is a block diagram illustrating a system for controlling gain in a wireless transceiver to compensate for temperature and frequency variations.

FIG. 2 is a block diagram illustrating a system 200 for controlling gain in a wireless transceiver to compensate for temperature and frequency variations. The system 200 includes a variable amplifier 210, a summation module 230, a gain control conditioning module 240, a digital-to-analog converter 250, and a low pass filter 260. In addition, the system 200 also includes a memory device 220 for storing a gain reference value, a temperature sensor 270, and a gain calibration module 290. The variable amplifier 210, summation module 230, gain control conditioning module 240, digital-to-analog converter 250, low pass filter 260, and gain calibration module 290 may be implemented using software, hardware, or a combination of software and hardware. In addition, the gain control system 200 illustrated in FIG. 2 may be included in a transceiver circuit, in a transmitter circuit, in a receiver circuit, or in some other type of circuit requiring gain compensation over temperature and frequency variations.

In operation, the variable amplifier 210 provides a gain $G_{AGC}(y)$ that may be varied by a control signal y. The gain $G_{AGC}(y)$ generated by the variable amplifier 210 may, for example, be an nonlinear function of the control signal y. The variable amplifier 210 may, for example, be a voltage-controlled amplifier that generates the gain $G_{AGC}(y)$ as a function of the voltage potential of the control signal y. The control signal y may be derived from a gain reference signal G1 and a gain variation signal $\Delta G(t,f)$, as described below.

The value of the gain reference signal G1 represents a desired gain value for the variable amplifier 210 while operating at a pre-selected reference frequency f1 and reference temperature t1. The value for the gain reference signal G1 may, for example, be calibrated at reference frequency f1 and reference temperature t1 and stored to the memory device 220 by the device manufacturer. For example, with reference to FIG. 5, the value of the gain reference signal G1 may be stored in the flash memory device 524. Alternatively, the gain reference signal G1 may be varied to reflect current device operating conditions using a closed loop (feedback) control circuit within the transceiver or using power control such as open loop and closed loop power control in which the transceiver works together with the other party of the wireless network (such as a base station transceiver when the system 200 is a handset transceiver or a handset transceiver when the system 200 is a base station transceiver).

The gain variation signal $\Delta G(t,f)$ is generated by the gain calibration module 290 based on an operating temperature signal (t) and an operating frequency signal (f) 280. The operating temperature signal (t) may be generated by a temperature sensing device 270 that monitors the temperature of the device. The operating frequency (f) 280 is dependent on the wireless communication channel being utilized by the device 200. The gain calibration module 290 may be a two-dimensional mapping module that uses the operating temperature (t) and the operating frequency (f) to determine a value for the gain variation signal $\Delta G(t,f)$, as described below with reference to FIGS. 3 and 4. The value of the gain variation signal $\Delta G(t,f)$ represents an amount by which the gain of the transceiver chain (including the variable amplifier 210 and other related components) at the operating temperature (t) and frequency (f) varies from the gain at the reference temperature t1 and frequency f1. Thus, if the device 200 is operating at the reference temperature (t1) and frequency (f1), then the gain variation $\Delta G(t, f)$ should equal zero.

The gain reference signal G1 and the gain variation signal $\Delta G(t,f)$ are input to the summation module 230 and are combined to generate a gain calibration signal G. The gain calibration signal G is then input to the gain control conditioning module 240 to generate a gain control signal x. The gain control conditioning module 240 may, for example, perform typical signal conditioning functions, such as changing the data format, data value re-mapping, changing the data rate, or other signal conditioning functions. The gain control signal x is converted from the digital domain to the analog domain by the digital-to-analog converter 250 and is smoothed by low pass filter (LPF) 260 to produce the control signal y for the variable amplifier 210.

Figure 3:
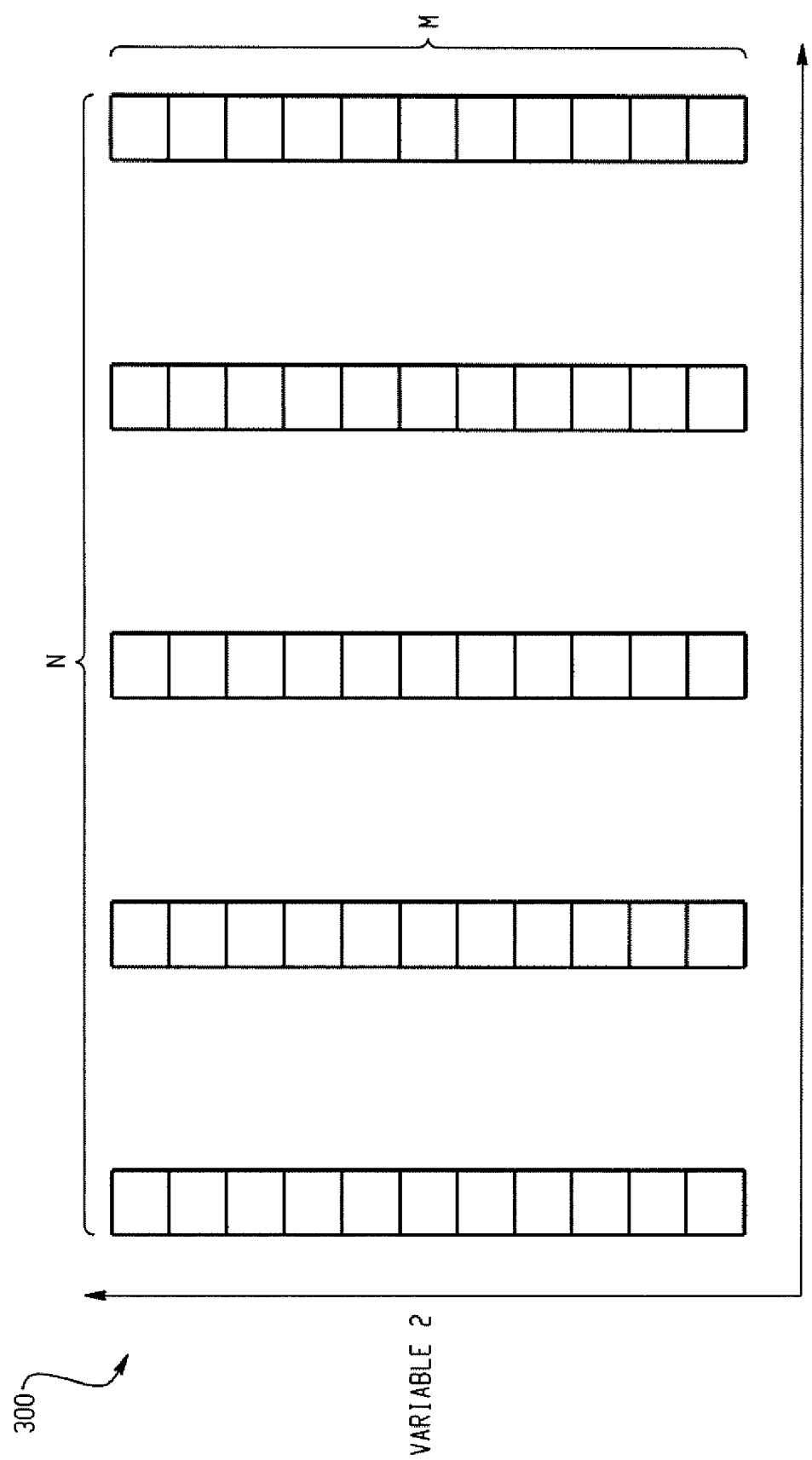
FIG. 3 shows an example two-dimensional (N×M) data array for a two-dimensional mapping module.

FIG. 3 shows an example two-dimensional (N×M) data array 300 for a two-dimensional mapping module 290. A two-dimensional mapping module incorporating the example N×M data array 300 may, for example, be utilized as the gain calibration module 290 of FIG. 2.

The two-dimensional (N×M) data array 300 includes N elements in a first dimension (variable 1) and M elements in a second dimension (variable 2). For the purposes of the two-dimensional mapping module 290 described herein, one of the variables represents operating frequency (f) and the other variable represents operating temperature (t). Each of the N×M elements store a gain variation value $\Delta G(t,f)$ corresponding to a discrete operating temperature (t) and a discrete operating frequency (f).

In operation, if the operating temperature (t) and operating frequency (f) inputs to the two-dimensional mapping module 290 respectively correspond to a discrete temperature and a frequency values included in the two-dimension (N×M) data array 300, then the gain variation value $\Delta G(t, f)$ may be selected directly from the N×M data array 300. Else, if one or both of the operating temperature (t) and operating frequency (f) inputs has a value that is between the discrete values represented in the N×M array 300, then interpolation may be used to determine the gain variation output value $\Delta G(t, f)$. Alternatively, the operating temperature (t) and operating frequency (f) inputs could be rounded to the nearest values represented in the N×M array in order to select a gain variation $\Delta G(t, f)$. In addition, the discrete frequency values represented in the N×M array 300 may, for example, be chosen to correspond to the designated operating frequencies for each of the available wireless communication channels.

The gain variation values $\Delta G(t, f)$ stored in the N×M data array 300 may, for example, be calibrated and stored to the device by the manufacturer. For instance, the actual gain variation at each frequency-temperature combination represented in the data array 300 may be measured and stored as a gain variation value $\Delta G(t, f)$ at the corresponding location in the array 300.

Figure 4:
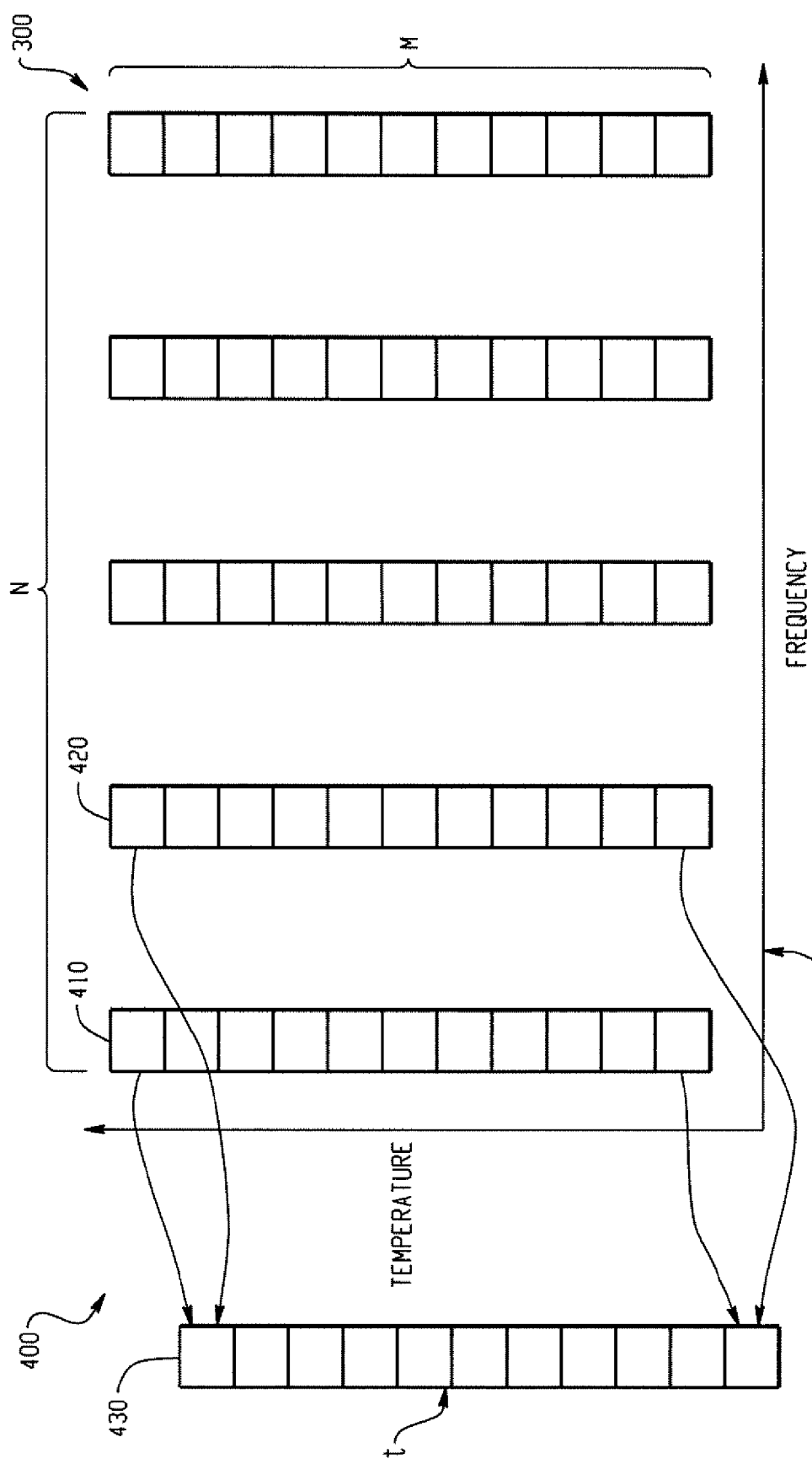
FIG. 4 shows another example two-dimensional (N×M) data array having a fast access vector.

FIG. 4 shows another example two-dimensional (N×M) data array 400 having a fast access vector 430. In some wireless systems, such as CDMA2000 (Code Division Multiple Access), the frequency does not change often, but temperature can change quickly (e.g., every few seconds). This example two-dimensional (N×M) array 400 adapts to fast temperature changes by including both an N×M array 300 and a fast access vector 430.

Once the operating frequency f is determined, a fast access vector 430 is determined by interpolation from the two nearest frequency vectors 410, 420 in the array 400. Alternatively, if the array 400 includes a frequency vector at the operating frequency, then the frequency vector may be used as fast access vector 430 without interpolation. In either case, the fast access vector 430 may be used to quickly select or interpolate gain variation values $\Delta G(t, f)$ at different operating temperatures.

Although the fast access vector 430 is illustrated separately from the N×M array, in alternate embodiments an (N+1)×M array could be used. More generally, an (N+1)×(M+1) array could also be used, with analogous fast access techniques employed in both dimensions, or an N×(M+1) array could be used, or any multiple of additional M sized and/or N sized storage elements could be used for fast access.

Figure 5:
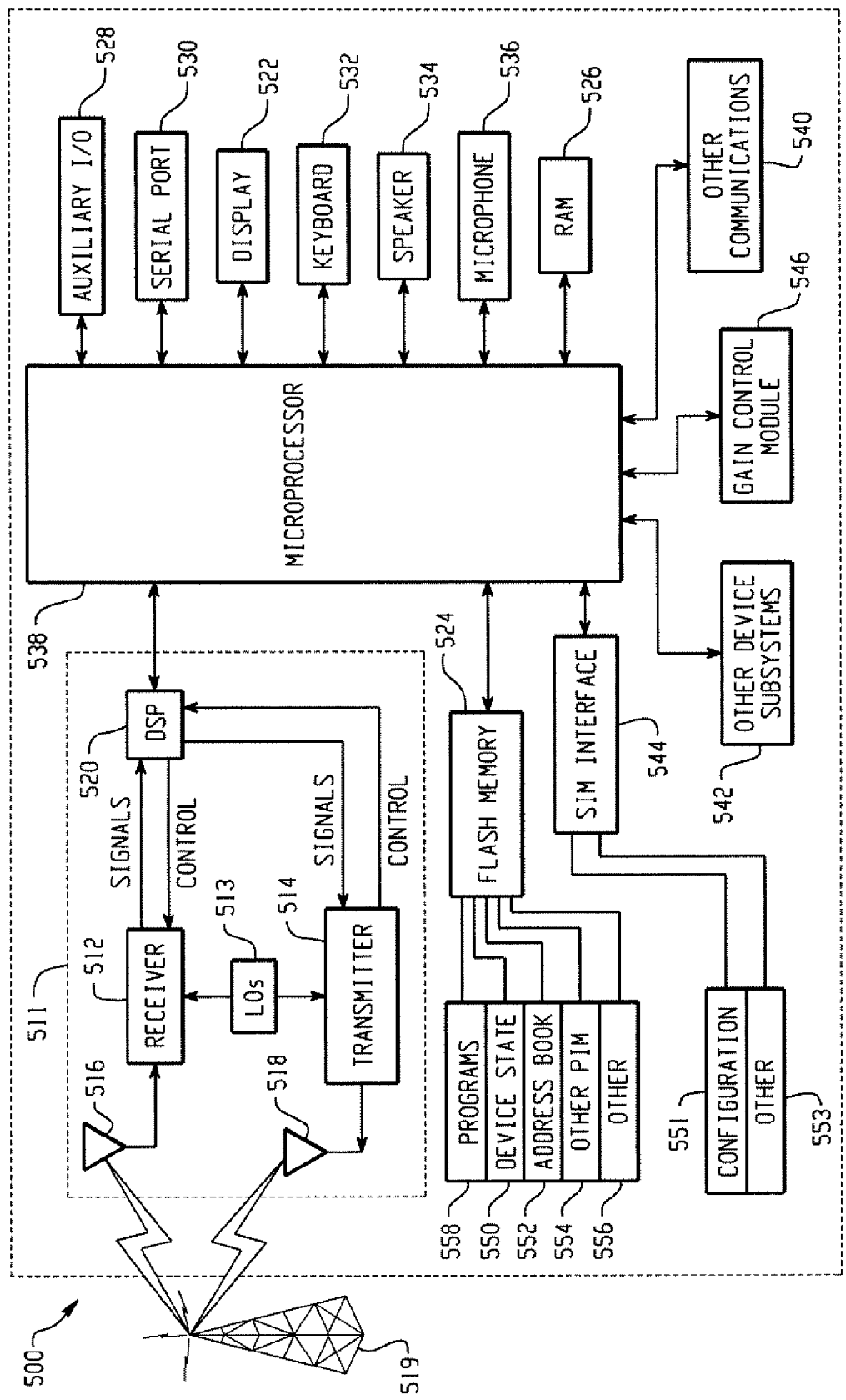
FIG. 5 is a block diagram of an example mobile communication device that may include the gain control system of FIGS. 2-4.

FIG. 5 is a block diagram of an example mobile communication device that may include the gain control system described above with reference to FIGS. 2-4. The mobile communication device 500 includes a processing subsystem 538, a communications subsystem 511, a short-range communications subsystem 540, a memory subsystem 524, 526, and various other device subsystems and/or software modules 542. The mobile communication device 500 also includes a user interface, which may include a display 522, a keyboard 532, a speaker 534, a microphone 536, one or more auxiliary input/output devices 528, a serial port 530, and/or other user interface devices.

The mobile communication device 500 may, for example, be operable as a two-way wireless communication device having voice and/or data communication capabilities. The mobile communication device 500 may, for example, also be operable to communicate with other computer systems over a computer network, such as the Internet.

If the mobile communication device 500 is enabled for two-way communication, then it may incorporate a communication subsystem 511. The communication subsystem 511 may include a receiver 512 and a transmitter 514, as well as associated components such as one or more, preferably embedded or internal, antenna elements 516 and 518, local oscillators (LOs) 513, and a processing module such as a digital signal processor (DSP) 520. It should be understood, however, that the particular design of the communication subsystem 511 is dependent upon the communication network in which the device is intended to operate. For example, the mobile communication device 500 may include a communication subsystem 511 designed to operate within the Mobitex™ mobile communication system, the DataTAC™ mobile communication system, GPRS network, UMTS network, CDMA2000, WCDMA, WLAN, or EDGE network.

Network access requirements may also vary depending upon the type of network 519. For example, in the Mobitex and DataTAC networks, the mobile communication device 500 is registered on the network using a unique identification number associated with each mobile communication device. In UMTS and GPRS networks, however, network access is associated with a subscriber or user of the mobile communication device 500. A GPRS mobile communication device uses a subscriber identity module (SIM) card to operate on a GPRS network. Without a valid SIM card, a GPRS mobile communication device (and other mobile communication devices requiring SIM like cards) may not be fully functional. Local or non-network communication functions, as well as legally required functions (if any) such as "911" emergency calling, may be available, but the mobile communication device 500 may be unable to carry out any other functions involving communications over the network 500. The SIM interface 544 is normally similar to a card-slot into which a SIM card can be inserted and ejected like a diskette or PCMCIA card. The SIM card can have approximately 64K of memory and hold many key configuration 551, and other information 553 such as identification, and subscriber related information.

When required network registration or activation procedures have been completed, the mobile communication device 500 may send and receive communication signals over the network 519. Signals received by the antenna 516 through the communication network 519 are input to the receiver 512, which may perform such functions such as signal amplification, frequency down conversion, filtering, channel selection and the like, and analog to digital (A/D) conversion. A/D conversion of a received signal allows more complex communication functions such as demodulation and decoding to be performed in the DSP 520. In a similar manner, signals to be transmitted are processed (e.g., modulated, encoded, etc.) by the DSP 520 and input to the transmitter 514 for digital to analog conversion, frequency up conversion, filtering, amplification and transmission over the communication network 519 via the antenna 518. In addition, the DSP 520 also provides receiver and transmitter control. For example, the gains applied to communication signals in the receiver 512 and transmitter 514 may be adaptively controlled through automatic gain control algorithms implemented in the DSP 520.

The mobile communication device 500 may include a processing subsystem 538, such as a microprocessor, which controls the overall operation of the device. Communication functions, such as data and voice communications, are performed through the communication subsystem 511. The processing subsystem 538 also interacts with other device subsystems, such as the display 522, flash memory 524, random access memory (RAM) 526, auxiliary input/output (I/O) subsystems 528, serial port 530, keyboard 532, speaker 534, microphone 536, a short-range communications subsystem 540 and any other device subsystems generally designated as 542.

Some of the subsystems shown in FIG. 5 perform communication-related functions, whereas other subsystems may provide "resident" or on-device functions. Some subsystems, such as the keyboard 532 and the display 522 may be used for both communication-related functions, such as entering a text message for transmission over a communication network, and device-resident functions such as a calculator or task list.

Operating system software used by the processing subsystem 538 may be stored in a persistent store such as flash memory 524, but could also be stored in a read-only memory (ROM) or similar storage element. The operating system, specific device applications, or parts thereof, may be temporarily loaded into a volatile memory such as RAM 526. Received communication signals may also be stored in RAM 526.

The flash memory 524 may be segregated into different areas for both computer programs 558 and program data storage 550, 552, 554 and 556. Each program can allocate a portion of flash memory 524 for data storage requirements. The processing subsystem 538, in addition to its operating system functions, may also enable execution of software applications on the mobile communication device. A predetermined set of applications that control basic operations, such as data and voice communication applications, may be installed on the mobile communication device 500 during manufacturing. One software application may be a personal information manager (PIM) application operable to organize and manage data items relating to the user of the mobile communication device, such as e-mail, calendar events, voice mails, appointments, and task items. One or more memory stores may be available on the mobile communication device to facilitate storage of PIM data items. The PIM application may be operable to send and receive data items, via the wireless network 519. The PIM data items are seamlessly integrated, synchronized and updated, via the wireless network 519, with the mobile communication device user's corresponding data items stored or associated with a host computer system. Further applications may also be loaded onto the mobile communication device 500 through the network 519, an auxiliary I/O subsystem 528, serial port 530, short-range communications subsystem 540 or any other suitable subsystem 542, and installed by a user in the RAM 526 or preferably a non-volatile store for execution by the microprocessor 538.

In a data communication mode, a received signal, such as a text message or web page download, may be processed by the communication subsystem 511 and input to the processing subsystem 538. The processing subsystem 538 may further processes the received signal for output to the display 522, or alternatively to an auxiliary I/O device 528. A user of the mobile communication device 500 may also compose data items, such as email messages, using the keyboard 532, which is preferably a complete alphanumeric keyboard or telephone-type keypad, in conjunction with the display 522 and possibly an auxiliary I/O device 528. Such composed items may be transmitted over a communication network through the communication subsystem 511.

The communication subsystem 511 may, for example, include a transceiver that operates with a gain control system, as described above with reference to FIGS. 2-4. For example, the DSP 520 may perform one or more of the gain control functions, described above. In addition, gain control functions, as describe with reference to FIGS. 2-4, may be performed by the gain control module 546 and/or the other device subsystems 542.

For voice communications, overall operation of the mobile communication device 500 is similar, except that received signals may be output to a speaker 534 and signals for transmission may be generated by a microphone 536. Alternative voice or audio I/O subsystems, such as a voice message recording subsystem, may also be implemented on the mobile communication device 500. Although voice or audio signal output is preferably accomplished primarily through the speaker 534, the display 522 may also be used to provide an indication of the identity of a calling party, the duration of a voice call, or other voice call related information for example.

The serial port 530 may, for example, be implemented in a personal digital assistant (PDA)-type mobile communication device to synchronize with a user's desktop computer. The serial port 530 may enable a user to set preferences through an external device or software application and may provide a path for information or software downloads to the mobile communication device 500 other than through a wireless communication network. The serial port 530 may, for example, be used to load an encryption key onto the device through a direct and thus reliable and trusted connection to enable secure device communication.

The serial port 530 may also be used to transfer calibration data used by the gain control system described above, for instance during the manufacture of device 500.

Other communications subsystems 540, such as a short-range communications subsystem, may also be included for communication between the mobile communication device 500 and different systems or devices, which need not necessarily be similar devices. For example, the subsystem 540 may include an infrared device and associated circuits and components or a Bluetooth™ communication module, or a wireless USB communication module, to provide for communication with similarly enabled systems and devices.

Figure 6:
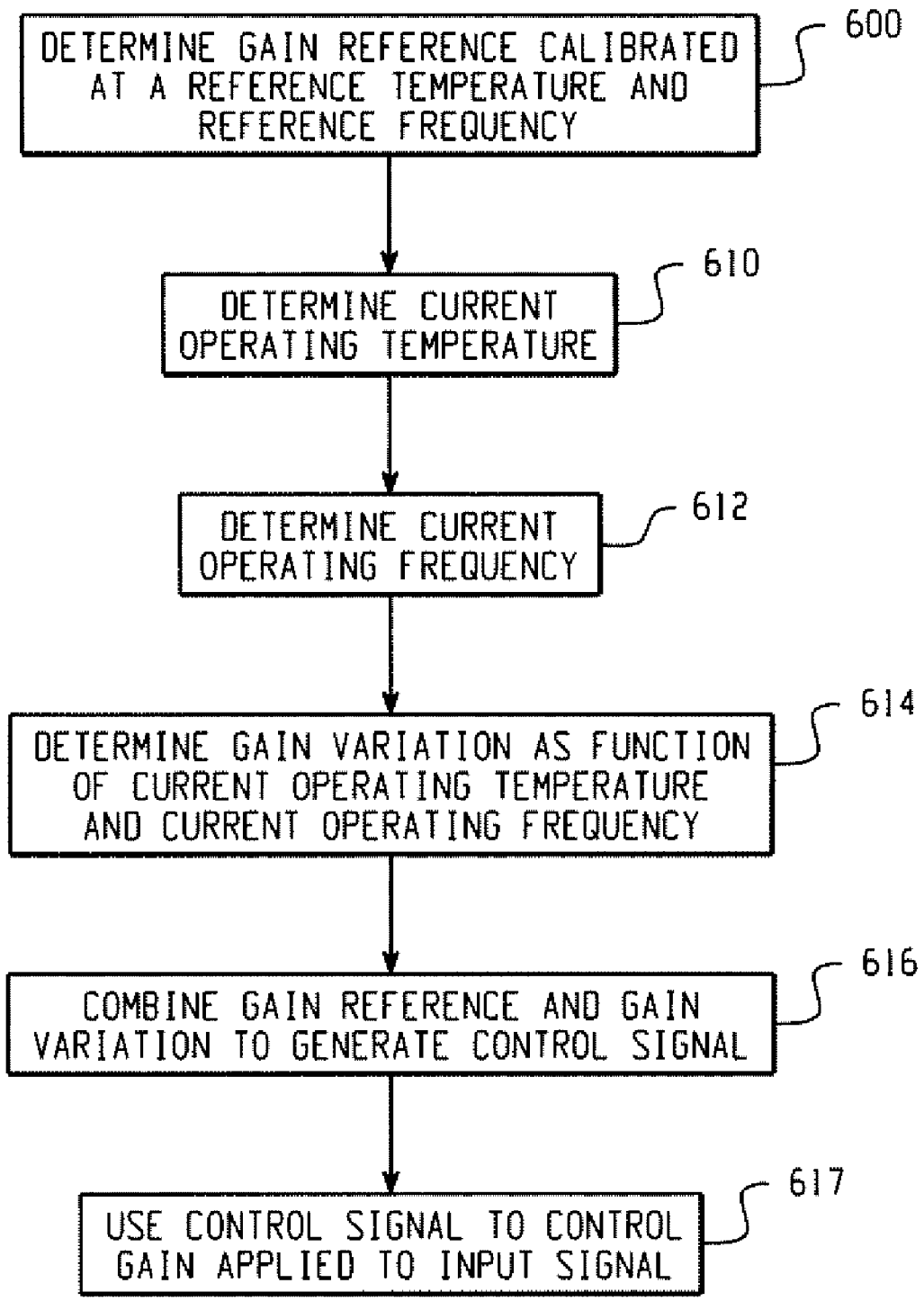
FIG. 6 is a flow diagram depicting an example method for controlling gain compensation over temperature and frequency variations.

FIG. 6 is a flow diagram depicting an example method for controlling gain compensation over temperature and frequency variations. In step 600 a gain reference is determined. The gain reference is calibrated at a reference temperature and a reference frequency. At step 610, a current operating temperature is determined. At step 612, a current operating frequency is determined. At step 614, a gain variation is determined. The gain variation is a function of both the current operating temperature and the current operating frequency. At step 616, the gain reference and the gain variation are combined to generate a control signal. At step 618, the control signal is used to control a gain applied to the input signal.

Figure 7:
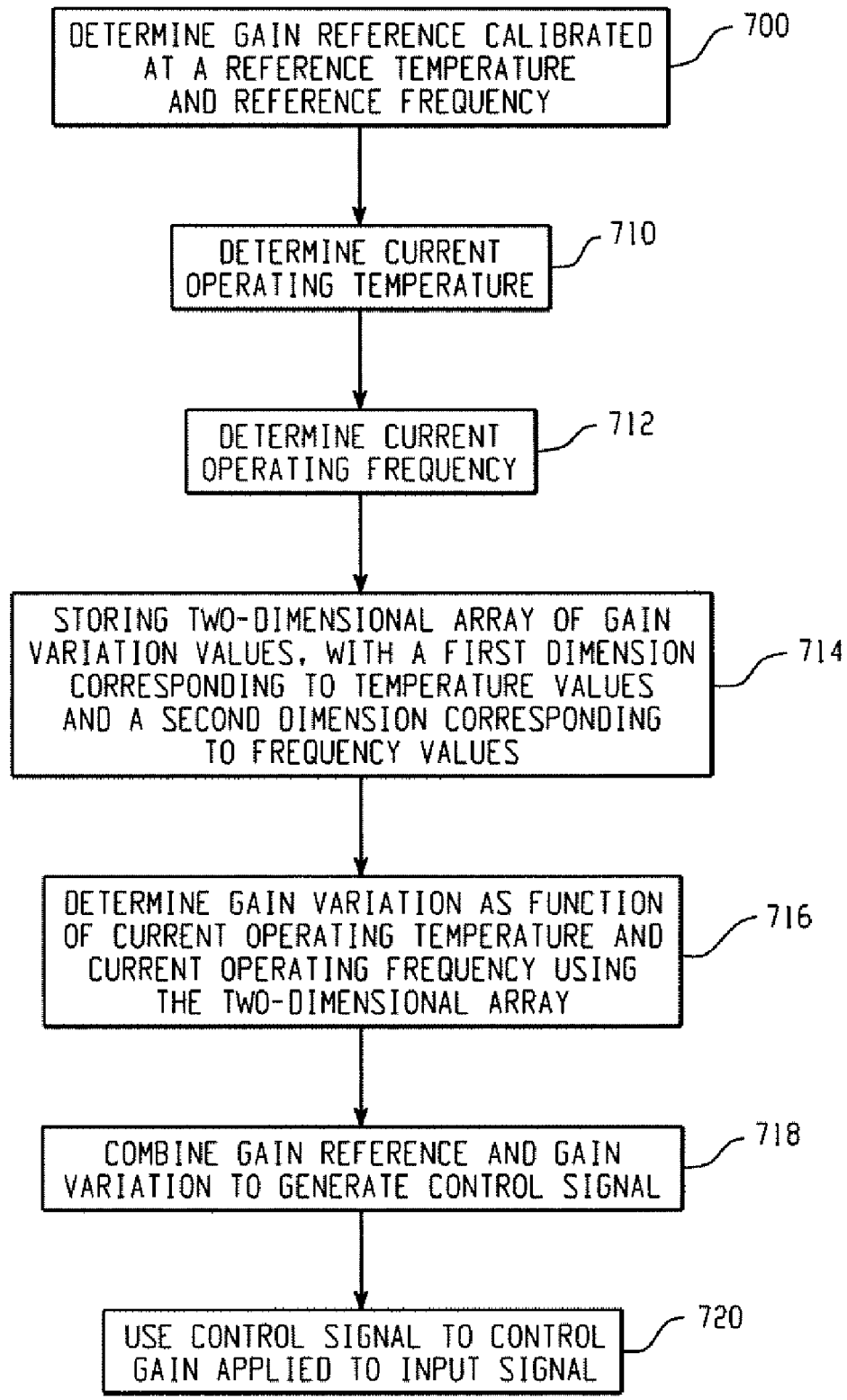
FIG. 7 is a flow diagram depicting another example method for controlling gain compensation over temperature and frequency variations.

FIG. 7 is a flow diagram depicting another example method for controlling gain compensation over temperature and frequency variations. In step 700 a gain reference is determined. The gain reference is calibrated at a reference temperature and a reference frequency. At step 710, a current operating temperature is determined. At step 712, a current operating frequency is determined. At step 714, a two-dimensional array of gain variation values is stored. The array includes a first dimension corresponding to temperature values and a second dimension corresponding to frequency values. At step 716, a gain variation is determined as a function of the current operating temperature and the current operating frequency using the two-dimensional array. At step 718, the gain reference and the gain variation are combined to generate a control signal. At step 720, the control signal is used to control a gain applied to the input signal.

Figure 8:
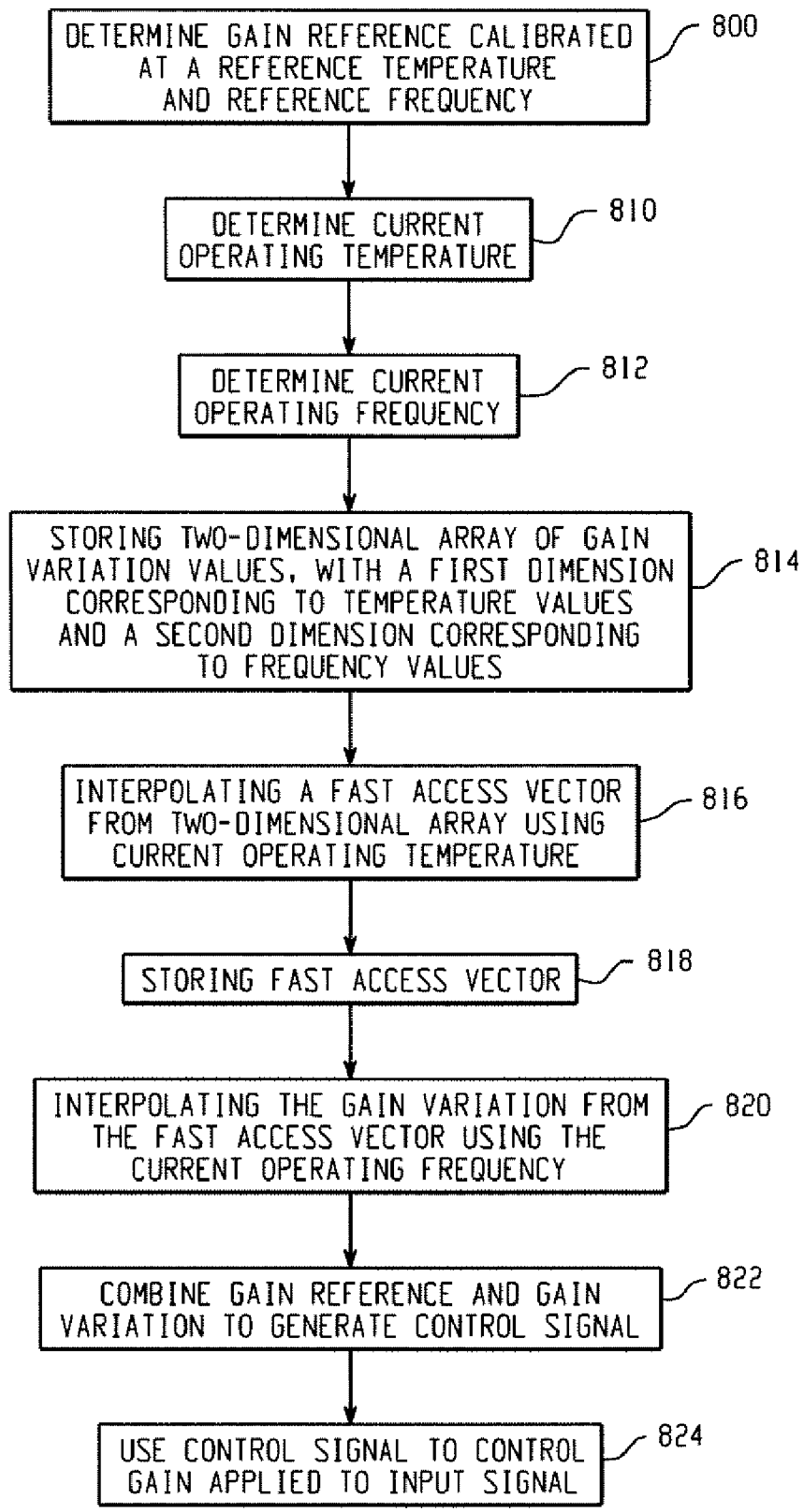
FIG. 8 is a flow diagram depicting a third example method for controlling gain compensation over temperature and frequency variations.

FIG. 8 is a flow diagram depicting a third example method for controlling gain compensation over temperature and frequency variations. In step 800 a gain reference is determined. The gain reference is calibrated at a reference temperature and a reference frequency. At step 810, a current operating temperature is determined. At step 812, a current operating frequency is determined. At step 814, a two-dimensional array of gain variation values is stored. The array includes a first dimension corresponding to temperature values and a second dimension corresponding to frequency values. At step 816, a fast access vector is interpolated from the two-dimensional array using the current operating temperature. In step 818, the fast access vector is stored. In step 820, the gain variation is interpolated from the fast access vector using the current operating frequency. At step 822, the gain reference and the gain variation are combined to generate a control signal. At step 824, the control signal is used to control a gain applied to the input signal.

This written description uses examples to disclose the invention, including the best mode, and also to enable a person skilled in the art to make and use the invention. The patentable scope of the invention may include other examples that occur to those skilled in the art.

It is claimed:

1. A gain control system, comprising:
  a variable amplifier that receives a control signal and an input signal, the variable amplifier being operable to apply a gain to the input signal to generate an output signal, wherein the gain is a function of the control signal;
  a summation module that combines a gain reference signal and a gain variation signal to generate the control signal;
  the gain reference signal being calibrated at a reference temperature and a reference frequency; and
  a gain calibration module that outputs the gain variation signal as a function of a current operating temperature and a current operating frequency;
  wherein the gain calibration module includes a two-dimensional array and a fast access vector, the fast access vector being interpolated from the two-dimensional array at the current operating frequency and the gain variation signal being interpolated from the fast access vector at the current operating temperature.

2. The gain control system of claim 1, wherein the gain calibration module is a two-dimensional mapping module that stores a two-dimensional array of gain variation values and uses the current operating temperature and current operating frequency to interpolate the gain variation signal from the two-dimensional array of gain variation values.

3. The gain control system of claim 1, further comprising a temperature sensor that monitors the current operating temperature.

4. The gain control system of claim 1, further comprising:
  a digital-to-analog converter coupled between the variable amplifier and the summation module, the digital-to-analog converter being operable to convert the control signal from the digital domain into the analog domain.

5. The gain control system of claim 1, further comprising:
  a low pass filter coupled between the variable amplifier and the summation module operable to filter high frequency transients from the control signal.

6. The gain control system of claim 1, wherein the variable amplifier is a voltage-controlled amplifier and the gain is a function of a voltage of the control signal.

7. A method for controlling gain compensation over temperature and frequency variations, comprising:
  determining a gain reference, the gain reference being calibrated at a reference temperature and a reference frequency;
  determining a current operating temperature;
  determining a current operating frequency;

determining a gain variation as a function of both the current operating temperature and the current operating frequency;

combining the gain reference and the gain variation to generate a control signal; and using the control signal to control a gain applied to an input signal;

storing a two-dimensional array of gain variation values, a first dimension corresponding to temperature values and a second dimension corresponding to frequency values, wherein the gain variation is determined from the two-dimension array;

interpolating a fast access vector from the two-dimensional array using the current operating temperature;

storm the fast access vector; and interpolating the gain variation from the fast access vector using the current operating frequency.

8. A mobile communication device, comprising:

a communication subsystem operable to send and receive electronic messages over a communication network;

a memory subsystem operable to store data and program information; and a processing subsystem operable to store and retrieve data in the memory subsystem, execute programs stored in the memory subprogram, and cause the communication subsystem to transmit and receive electronic messages over the communication network;

the communication subsystem including:

a variable amplifier that receives a control signal and an input signal, the variable amplifier being operable to apply a gain to the input signal to generate an output signal, wherein the gain is a function of the control signal;

means for combining a gain reference signal and a gain variation signal to generate the control signal, wherein the gain reference signal is calibrated at a reference temperature and a reference frequency; and means for generating the gain variation signal as a function of a current operating temperature and a current operating frequency using a two-dimensional array and a fast access vector, the fast access vector being interpolated from the two-dimensional array at the current operating frequency and the gain variation signal being interpolated from the fast access vector at the current operating temperature.

* * * * *

UNITED STATES PATENT AND TRADEMARK OFFICE
CERTIFICATE OF CORRECTION

PATENT NO.       : 7,356,102 B2
APPLICATION NO.  : 10/725689
DATED            : April 8, 2008
INVENTOR(S)      : Morton et al.

It is certified that error appears in the above-identified patent and that said Letters Patent is hereby corrected as shown below:

Column 9, line 15, please replace "storm" with -- storing --

Signed and Sealed this

Twenty-fourth Day of August, 2010

David J. Kappos
*Director of the United States Patent and Trademark Office*